United States Patent [19]

Nicklaus

[11] 4,205,773

[45] Jun. 3, 1980

[54] CONTACTING DEVICE FOR MAKING A WIRE CONNECTION ON A MICROCIRCUIT

[75] Inventor: Karl Nicklaus, Steinhausen, Switzerland

[73] Assignee: ESEC Sales SA, Zug, Switzerland

[21] Appl. No.: 938,042

[22] Filed: Aug. 30, 1978

[30] Foreign Application Priority Data

Sep. 7, 1977 [CH] Switzerland .......... 10963/77

[51] Int. Cl.² .......... B23K 19/04
[52] U.S. Cl. .......... 228/4.5; 228/56.5; 228/103; 226/160; 226/162; 219/56.21
[58] Field of Search .......... 228/4.5, 1 R, 56.5, 228/110, 103; 226/160, 162–167; 219/56.21, 56.1

[56] References Cited

U.S. PATENT DOCUMENTS

| | | | |
|---|---|---|---|
| 1,707,943 | 4/1929 | Pocovi | 226/160 |
| 2,308,606 | 1/1943 | Ingerson | 228/4.5 |
| 3,520,459 | 7/1970 | McCrady | 226/167 |
| 3,643,321 | 2/1972 | Field et al. | 228/4.5 |
| 3,672,556 | 6/1972 | Diepeveen | 228/4.5 |
| 3,863,827 | 2/1975 | Foulke et al. | 228/1 R |
| 3,941,486 | 3/1976 | Tyler | 228/4.5 |

*Primary Examiner*—Daniel C. Crane
*Attorney, Agent, or Firm*—Haseltine, Lake & Waters

[57] ABSTRACT

A contacting device for making a wire connection on a microcircuit by applying ultrasonics or thermocompression. A contacting horn is provided with a capillary which, in turn, is associated with a wire clamping device for feeding or clamping the wire during movement of the contacting horn. The wire clamping device has two clamping members for grasping the wire. The clamping members are movable relative to each other for clamping the wire, and both are arranged to pivot jointly to move the clamped wire in its lengthwise direction. A controllable actuation unit is each associated with the second clamping member which moves relative to the first, and the two clamping members jointly. The clamping members may be formed as a strip for grasping the wire between outer end regions. The second clamping member is mounted on a support of the first clamping member, and its outer end is pressed by a leaf spring fastened to the first clamping member.

4 Claims, 3 Drawing Figures

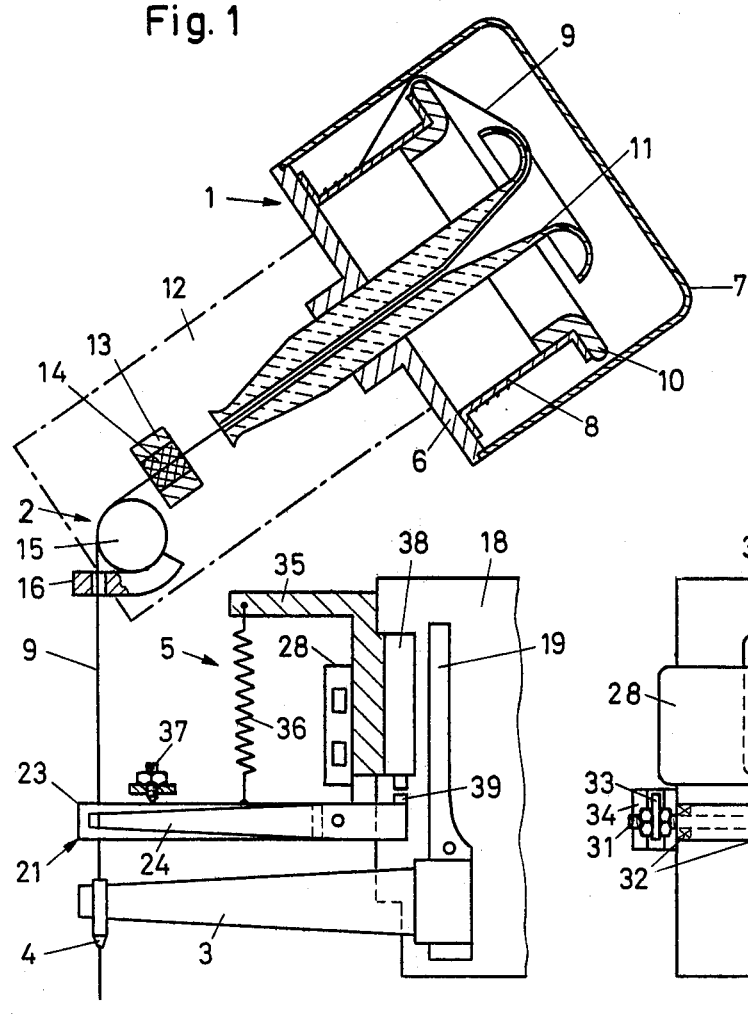
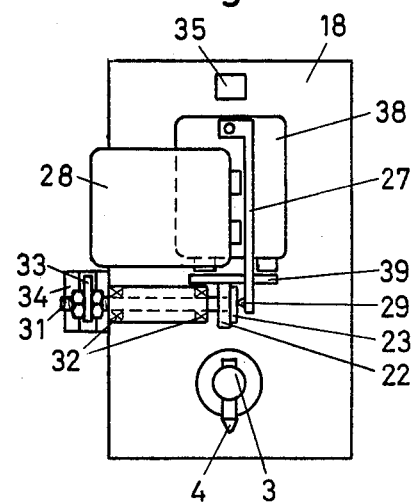
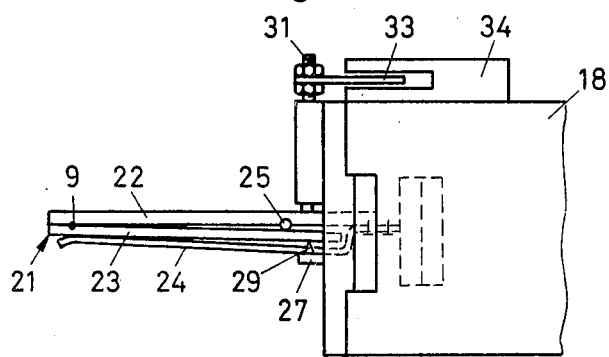

CONTACTING DEVICE FOR MAKING A WIRE CONNECTION ON A MICROCIRCUIT

BACKGROUND OF THE INVENTION

The present invention relates to a contacting device for making a wire connection on a microcircuit by means of ultrasonics or thermocompression, with a wire supply coil, a wire guide and a contacting horn equipped with a capillary. The capillary is associated with a wire clamping device for effecting a feed or a clamping of the wire during movement of the contacting horn.

Contacting devices of this type are known from U.S. Pat. No. 3,643,321 and Swiss Pat. No. 592,365. With these devices, to produce a contact with gold wire on a wire end exiting from the capillary, a small ball is fused on which then by lowering the contacting horn the capillary is pressed on the contact point of the microcircuit. The capillary is simultaneously heated or has ultrasonic energy applied to it. After making this ball connection, through another movement of the contacting horn, the wire is pulled in a loop to a second point of the microcircuit to be contacted and connected there by a wedge bonding process to the microcircuit. The wire is then torn from this wedge bond connection, and at the same time care is taken that a small portion of the wire in the capillary projects beyond the mouth of the capillary so that a new wire ball may be fused on.

The length of the wire portion projecting beyond the mouth of the capillary before fusing a wire ball largely determines the diameter of the fused-on ball so that, to achieve a uniform ball diameter, this wire portion after ball bonding should have the same length at the second contacting point. Since with the known devices the length of this wire portion is determined by the level of the second contacting point, because the wire from this point is pulled to a certain height of the moving capillary through the latter, the lengths of the wire portions and hence also the ball diameter have deviations in a detrimental manner depending on the level of the second contacting point in the process.

Furthermore, the adhesion of the squeezed-off wire at the second contacting point is very low, and must be very low so that, when tearing off the wire, the wedge bond connection with the microcircuit is not damaged. Since with the known devices the projecting wire portion is pulled from the capillary before being torn from the capillary, it is possible that with insufficient adhesion of the wire to the wedge bond connection, the wire will tear too early so that the wire portion projecting beyond the mouth of the capillary does not have the required length and thus only a wire ball with too small a diameter or no wire ball at all is fused on.

It is therefore an object of the present invention to provide a contacting device which permits the formation of a uniform wire ball even with variable level of the wedge bond produced by the process at the second contacting point and with infinitesimal adhesion of the wedge-bonded wire.

Another object of the present invention is to allow monitoring the adhesion of the wedge bond before making the next ball bond connection.

A further object of the present invention is to provide a device of the foregoing character which is substantially simple in construction and may be economically fabricated.

It is also an object of the present invention to provide an arrangement, as described, which has a substantially long operating life and may be readily maintained in service.

SUMMARY OF THE INVENTION

The objects of the present invention are achieved by providing that the wire clamping device has two clamp elements for grasping the wire. Of these elements, the second one is movable relative to the first in order to clamp the wire. Both are jointly pivotal to move the clamped wire in its lengthwise direction. A controllable actuating unit is associated with the second clamping element and the two clamping elements. By means of this wire clamping device, all required wire movements can be undertaken without using the fastening of the wire end on the microcircuit controlled in a uniform manner independent of the microcircuit, this avoiding troubles while the connection is made.

The novel features which are considered as characteristic for the invention are set forth in particular in the appended claims. The invention itself, however, both as to its construction and to its method of operation, together with additional objects and advantages thereof, will be best understood from the following description of specific embodiments when read in connection with the accompanying drawings.

BRIEF DESCRIPTION OF THE DRAWINGS

FIG. 1 shows a partial schematic side view of the contacting device;

FIG. 2 shows a plan view of the wire clamping device of FIG. 1; and

FIG. 3 shows a frontal view of the wire clamping device of FIG. 1.

DESCRIPTION OF THE PREFERRED EMBODIMENTS

The contacting device shown in FIG. 1 has a wire supply coil 1, a wire guide device 2, a contacting horn 3 with a capillary 4 and a wire clamping device 5.

The wire supply coil includes a coil body 8 which is mounted on a base plate 6 and enclosed by a protective cover 7; this coil body is wound with wire 9, for example, a gold wire. The upper flange of the coil body 8 is equipped with a slip ring 10 via which the wire 9 is unwound in a centered funnel 11, this may be of glass, from coil body 8. A wire cleaner 14, through which the wire 9 passes, is located on a carrier plate 12 (shown in phantom in FIG. 1) connected to the base plate 6. The wire 9 then passes over a deflecting roller 15 and a wire guide 16 to capillary 4 of the contacting horn 3.

The contacting horn 3 is arranged in a known manner on a housing 18 (part of which is shown) which can be moved vertically, i.e., in the z-direction, by a guide (not shown). The housing 18 is guided along a base (not shown) which is fastened to a cross table by means of which the contacting horn 3 and hence the capillary can be positioned in an x,y-plane perpendicular to the drawing plane of FIG. 1 in a known manner. The contacting horn 3 is fastened in the lower portion of a pivotal horn suspension 19 in the housing; the upper end of this suspension is equipped with controllable actuating means for swinging the horn suspension 19, for example, an electromagnet. These actuating means are not shown in FIG. 1; they are described together with driving means for vertically shifting housing 18, in Swiss Pat. No. 592,365. Also, the contacting horn 3 is equipped with means (not shown) for the controlled heating of the capillary 4 or to furnish ultrasonic energy for connecting the wire 9 with the microcircuit.

The wire clamping device 5 shown in FIGS. 1 to 3 also is located on housing 18 and hence follows the vertical displacement of the housing. The device contains a wire clamp 21 which presses a first clamping member 22. This is fixed when the wire 9 is being clamped. A second clamping member 23 is pivotally fastened to clamping member 22, and a leaf-shaped closure spring 24 which is fastened to the first clamping member 22, and the outer end of the second clamping member 23 against the first clamping member 22 thus clamps the wire passing between the two clamping members. As pivot bearing for the second clamping member 23, the first clamping member 22 has a pin 25 or similar projection. The first clamping member 22 and hence also the second clamping member 23 and the closure spring 24 are pivotally mounted on housing 18 in a manner to be explained subsequently so that the outer ends of clamping members 22, 23 can move within a small pivotal range in the lengthwise direction of the wire.

To open the wire clamp, a switch lever 27 (shown only in FIGS. 2 and 3) is fastened to housing 18; under the action of an electrically operated clamping magnet 28 (FIGS. 1, 3) it pushes against the interior portion of movable clamping member 23 and thus lifts the outer end of clamping member 23 against the action of closure spring 24 from the fixed clamping 22 so that wire 9 is released. The switch lever 27 has a tip 29 which passes through an opening in closure spring 24 and hence can push against the movable clamping member 23 without acting on the closure spring. In FIG. 3 the closure spring 24 was omitted for the sake of clarity.

The fixed clamping member 22 has fastened to it a horizontal shaft 31 which is mounted on the housing 18 by ball bearings 32. The free end of shaft 31 has a switch marker 33 which operates in conjunction with a sensor 34 fastened to housing 18 (the sensor is only shown schematically). The sensor 34 scans the rotated position of switch marker 33 and hence the pivotal position of clamping member 22 and upon reaching a certain rotated position generates an electrical signal.

The wire clamp 21 is pulled upward by a spring 36, fastened to the fixed clamping member 22 and anchored via a spring suspension 35 to housing 18, against an adjustable stop 37 (FIG. 1). The spring suspension 35 may have means for adjusting the spring tension of spring 36.

To produce a pivotal movement of wire clamp 21, an additional electrically energized magnet 38 (FIG. 1, 3) is located on housing 18. This magnet acts on an armature 39 attached to the fixed clamping member 22 and causes the wire clamp 21 to pivot about the axis of shaft 31 in a counterclockwise sense (FIG. 1). After the magnet 38 is de-energized, the wire clamp 21 is moved back by the spring 36 against the stop 37.

To produce the movements described below when making a wire connection on a microcircuit, there is provied a programmed control unit (not shown) which energized and de-energized magnets 28 and 38 at certain points in time and also delivers control signals for pivoting the contacting horn 3 and displacement of housing 18 in the x,y,z directions.

For example, during the operation of the contacting device in accordance with the present invention, the following steps may occur.

1. The contacting horn 3 is lowered with the wire ball lying at the mouth of capillary 4 onto the first contacting point of the microcircuit. During this action the pivoting magnet 38 is de-energized so that the wire clamp 21 rests against stop 37. While lowering the contacting horn 3 or housing 18, the clamping magnet 28 is energized, so that the movable clamping member 23 is lifted by means of switch lever 27 from the fixed clamping member 22 in the region of wire 9, i.e., the wire clamp 21 is opened.

2. The time for making the ball bond connection on the microcircuit runs out.

3. Immediately after the time for making the ball bond connection has run out, the clamping magnet is de-energized, and the wire clamp 21 is closed since the closure spring 24 presses the movable clamping member 23 in the region of wire 9 against the fixed clamping member.

4. During the subsequent lifting of contacting horn 3 or housing 18 to a higher position to form a stretched wire section between the ball bond connection and the capillary 4, which later produces the wire connection to the second contacting point of the microcircuit, the closed wire clamp 21 is pivoted downward against the tension of spring 36 so that the force of spring 36 acts on the ball bond connection on the microcircuit and hence tests the adherence of the ball bond connection. If the ball bond connection on the microcircuit does not hold or is not adequate, the wire clamp 21 is pulled by the spring 36 upwards against the stop 37. During the lifting of contacting horn 3 or housing 18, the sensor 34, which is actuated by switch marker 33 during the downward movement of wire clamp 21, is continually monitored by the control unit (not shown).

5. A signal from the sensor indicates that the wire clamp 21 when pulling up wire 9 to form the stretched wire section moves downward and hence the ball bond connection is proper. If there is no sensor signal until reaching the height of contacting horn 3 corresponding to a certain length of the stretched wire section, indicating a defective ball bond connection because the wire clamp 21 rests against stop 37, a trouble signal is initiated and the process of making the ball bond connection is repeated.

6. The signal of sensor 34 indicating a correct ball bond connection immediately energizes clamping magnet 28. After a time delay for opening the wire clamp 21, the pivot magnet 38 is energized swinging the opening wire clamp 21 all the way down.

7. After reaching the height of contacting horn 3 or housing 18 required for the set length of the stretched wire section, the clamping magnet 28 is switched off again, closing wire clamp 21.

8. With wire clamp 21 closed and pivot magnet 38 energized, i.e., with wire clamp 21 pivoted downward, the contacting horn 3 and housing 18 in the x,y,z directions is brought with its capillary 4 to the second contacting point of the microcircuit.

9. Immediately before producing the wedge bond connection at the second contacting point, the clamping magnet 28 is energized so that wire clamp 21 is opened.

10. At the second contacting point, the wire 9 is squeezed off by the capillary 4. At the same time, the pivot magnet 38 is de-energized so that the wire clamp 21 pivots upward to stop 37.

11. Immediately after squeezing off the wire 9, the clamping magnet 28 is de-energized again, closing wire clamp 21.

12. The contacting horn 3 and housing 18 are lifted to the initial or zero position. Since the wire clamp 21 is closed, the spring 36 exerts a pull on the wire 9 so that the wire is pulled from the wedge bond connection on the microcircuit. Then the pivot magnet 38 is energized so that a certain wire length corresponding to the pivot stroke of wire clamp 21 is pushed through the capillary 4. Independent of the time at which during lifting the contacting horn 3 and housing 18 the wire 9 is effectively pulled from the wedge bond connection, after the pivot magnet 38 is energized, always the same length of wire projects out of the mouth of the capillary 4.

13. With pivot magnet 38 energized, the melting process forming the ball to the wire section is initiated.

14. Then the clamping magnet 28 is energized, opening the wire clamp 21.

15. After reaching the initial or zero position in the z-direction, the pivot magnet is de-energized, pivoting the wire clamp 21 against the stop 37. Then the next wire connection can be made in accordance with the above steps.

In contrast with conventional contacting devices, the device in accordance with the present invention has several advantages. The most important advantage is the uniform length of the wire section required to form a fused-on ball. This length is independent of wire connections made on a microcircuit; this length moreover, remains unchanged even if the adhesion of the wedge-bond connection is virtually zero. Another important advantage is the possibility of testing the adhesion and hence the quality of the ball bond connection in a defined manner, without interrupting the wire connection process or subsequent measures. Because of its low susceptibility to trouble and simple controllability, the device in accordance with the present invention is particularly well suited for automatic wire connection machines. Trouble avoidance is aided by the wire cleaner 14 which prevents early clogging of the capillary and metal build-up on the capillary tip from metal dust on the wire and which simultaneously acts as wire brake.

Instead of sensor 34 operated by the switch marker 33, another sensing element for the pivotal motion of wire clamp 21 may be used, for example, a sensing element which acts directly with the wire clamp 21 in the vicinity of stop 31 and not via shaft 31.

Because of its separate functions of wire clamping and wire movement, the described wire clamping device 5 can be used to advantage in other control programs.

Without further analysis, the foregoing will so fully reveal the gist of the present invention that others can, by applying current knowledge, readily adapt for various applications without omitting features that, from the standpoint of prior art, fairly constitute essential characteristics of the generic or specific aspects of this invention, and therefore, such adaptations should and are intended to be comprehended within the meaning and range of equivalence of the following claims.

I claim:

1. A contacting device for producing a wire connection on a microcircuit by ultrasonic or thermo-compression comprising: a contacting horn having capillary means; a wire supply coil mounted adjacent the contacting horn for supplying wire to the capillary means; wire clamping means cooperating with said capillary means for feeding or clamping said wire during movement of said contacting horn, said wire clamping means and contacting horn being attached to common support means; said clamping means having a first and a second clamping member for grasping said wire, said second clamping member being movable relative to said first clamping member for clamping said wire; both said clamping members pivotting jointly for moving clamped wire in its lengthwise direction; controllable actuation means having first electromagnetic means associated with said second clamping member and having second means associated with both clamping members, said first means of said actuation means producing movement of said second clamping member relative to the first clamping member, said second means of said actuation means producing pivotal movement jointly of both clamping members; said clamping members comprising strip means for grasping said wire between their outer end regions; a support on said first clamping member for mounting said second clamping member; leaf spring means fastened to said first clamping member for pressing the outer end of said second clamping member against said first clamping member; lever means for lifting the outer end of said second clamping member by acting on said support mounting said second clamping member; said first clamping member being pivotal about an axis perpendicular to the lengthwise direction of the wire; second electromagnetic means for pivotting the outer end of said first clamping member into the lengthwise direction of the wire; said clamping means comprising spring means pushing said first clamping member opposite to pivotal direction of said second electromagnetic means against an adjustable stop so that said second electromagnetic means produces wire advancement of predetermined length; said wire clamping means having sensor means for scanning pivotal motion of said first clamping member in opposition to the force applied by said spring means when said first and second electromagnetic means are de-energized and the capillary means is moved away from a wire connection on a microcircuit thereby causing movement of the wire and pivoting movement of the wire clamping means.

2. A contacting device as defined in claim 1 including first electromagnetic means for actuating said lever means.

3. A contacting device as defined in claim 1, including wire cleaning means located ahead of said wire clamping means and enclosing said wire, said wire cleaning means being simultaneously operative as a wire brake.

4. A contacting device as defined in claim 1, wherein said sensor means provides an electrical signal dependent on the pivotal motion of said first clamping member for energizing said first means of said actuation means to indicate adequate wire connection.

* * * * *